United States Patent
Ahn et al.

(10) Patent No.: US 6,949,447 B2
(45) Date of Patent: Sep. 27, 2005

(54) METHOD FOR FABRICATING ISOLATION LAYER IN SEMICONDUCTOR DEVICE

(75) Inventors: Sang Tae Ahn, Kyoungki-do (KR); Sung Woong Chung, Kyoungki-do (KR); Hyun Chul Sohn, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 1 day.

(21) Appl. No.: 10/738,399

(22) Filed: Dec. 17, 2003

(65) Prior Publication Data

US 2004/0214405 A1 Oct. 28, 2004

(30) Foreign Application Priority Data

Apr. 23, 2003 (KR) .............................. 10-2003-0025775

(51) Int. Cl.[7] .............................................. H01L 21/76
(52) U.S. Cl. ...................................................... 438/436
(58) Field of Search ................................ 257/506, 510, 257/513, 524; 438/353–362, 424–428, 435–439, 660, 795

(56) References Cited

U.S. PATENT DOCUMENTS

| | | | |
|---|---|---|---|
| 4,952,524 A | * | 8/1990 | Lee et al. .................... 438/437 |
| 5,866,459 A | | 2/1999 | Naem et al. |
| 5,891,809 A | | 4/1999 | Chau et al. |
| 5,956,598 A | | 9/1999 | Huang et al. |
| 6,013,559 A | | 1/2000 | Wu et al. |
| 6,150,238 A | * | 11/2000 | Wu et al. .................... 438/435 |
| 6,444,541 B1 | | 9/2002 | Lai et al. |
| 2003/0124465 A1 | * | 7/2003 | Lee et al. .................... 430/314 |

* cited by examiner

*Primary Examiner*—David Nelms
*Assistant Examiner*—Calvin Lee
(74) *Attorney, Agent, or Firm*—Ladas & Parry LLP

(57) ABSTRACT

A method for fabricating an isolation layer in a semiconductor device is disclosed. The disclosed method comprises steps of: forming a trench on a semiconductor substrate; forming a flowing insulating layer within the trench; making the insulating layer precise; and forming a precise insulating layer over an upper surface of the whole structure on which the flowing insulating layer is formed. According to the method of fabricating an isolation layer in a semiconductor device, occurrence of fine pores at adjacent active regions of sidewalls in a trench can be prevented.

22 Claims, 6 Drawing Sheets

METHOD FOR FABRICATING ISOLATION LAYER IN SEMICONDUCTOR DEVICE

BACKGROUND OF THE INVENTION

1. Field of the Invention

The present invention relates to a method for fabricating an isolation layer in a semiconductor device, and more particularly to a method for fabricating an isolation layer in a semiconductor device which can improve the ability to fill fine patterns.

2. Description of the Prior Art

As generally known in the art, a width of an isolation insulating layer formed in a STI (Shallow Trench Isolation) process decreases with the advance of integration degree in a semiconductor device. Although the isolation insulating layer in the semiconductor device is formed according to a APCVD (Atmosphere Pressure Chemical Vapor Deposition) or a HDPCVD (High Density Plasma Chemical Vapor Deposition) process, limitations exist in their ability to fill fine patterns in a conventional isolation insulating layer as a width of a shallow trench decreases.

Further, in the case of a flowing SOD (Spin On Dielectric) insulating layer, although it is good in its ability to fill fine patterns, as the density of the filled insulating layer is so low as to result hi the loss of insulation due to loss of the insulating layer in the following etching and cleaning processes, and the insulation of the semiconductor device decreases due to permeation of ions into the STI insulating layer having a low density in the following ion implanting process.

A method for depositing fine insulating layer again after depositing the SOD insulating layer in order to solve the above problems has-been researched, however it has been impossible to make the insulating layer filled in more minute fine patterns because a thickness of the insulating layer deposited by means of the SOD insulating layer is bigger than the width of the fine patterns.

The above conventional method for fabricating an isolation layer by using the SOD insulating layer as a flowing insulating layer is described below with reference to FIG. 1 and FIG. 2.

As shown in FIG. 1, after a pad oxide film 13 and a pad nitride film 15 are stacked on a silicon substrate 11, a trench (not shown) is formed by performing excessive etching of the silicon substrate 11 together with these films by using a mask (not shown) for making a trench.

Then, a plasma treatment is performed with using a $N_2O$ or $O_2$ plasma, before forming the SOD insulating layer 19.

Subsequently, the SOD insulating layer 19 is deposited in the trench (not shown), and then an insulating layer (not shown) for filling gaps is deposited on an upper surface of overall structure inclusive of the SOD insulating layer 19 in the following process, and the process for fabricating the isolation layer of the semiconductor device progresses continuously.

However, according to the prior art, in the case of forming a flowing insulating layer in a portion with narrow space at the time of fabricating highly integrated semiconductor device, as shown by "A" in FIG. 1 and FIG. 2, fine pores are produced beside the active regions at sides of the trench in particular when the flowing SOD insulating layer is deposited in the trench.

Further, although $O_2$ plasma is used in place of $N_2O$ plasma in the case of performing plasma treatment as a pretreatment process before depositing the flowing insulating layer, the removal of the fine pore defects has not been considerably improved.

SUMMARY OF THE INVENTION

Accordingly, the present invention has been made to solve the above-mentioned problems occurring in the prior art, and an object of the present invention is to provide a method for fabricating an isolation layer in a semiconductor device which can effectively prevent formation of fine pores at adjacent active regions of side walls of the trench.

In order to accomplish this object, there is provided a method for fabricating an isolation layer in a semiconductor device, the method comprising the steps of: forming a trench on a semiconductor substrate; forming a flowing insulating layer within the trench; making the insulating layer precise; and forming a precise insulating layer over an upper surface of the whole structure on which the flowing insulating layer being formed.

Also, there is provided a: method for fabricating an isolation layer in a semiconductor device, the method comprising the steps of: providing a semiconductor substrate on which a trench is formed; carrying out a pretreatment of the trench; forming a flowing insulating layer below the pretreated trench; post-cleaning the flowing insulating layer; making the insulating layer precise; forming an insulating layer on an upper surface of whole structure on which the precise flowing insulating layer is formed; and forming a thermal insulating layer above the insulating layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
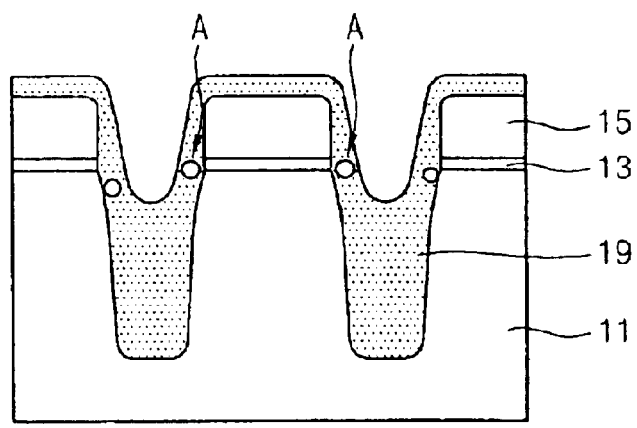
FIG. 1 is a cross-sectional view of a process according to a prior art method of fabricating an isolation layer in a semiconductor device, which shows fine pores produced at a flowing insulating layer formed at sides of a trench.
Figure 2:
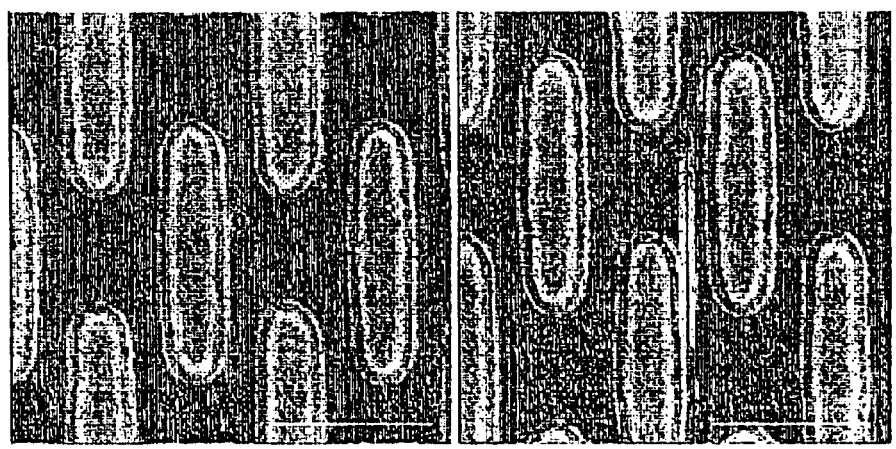
FIG. 2 is a photograph of a cross-section illustrating a prior art method for fabricating an isolation layer in a semiconductor device, which shows fine pores defects produced at a flowing insulating layer.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 3A through 3D are cross-sectional views of a process each illustrating a method for fabricating an isolation layer in a semiconductor device according to one embodiment of the present invention, and FIGS. 4A through 4D are cross-sectional views of a process each illustrating a method for fabricating an isolation layer in a semiconductor device according to another embodiment of the present invention.

Figure 5:
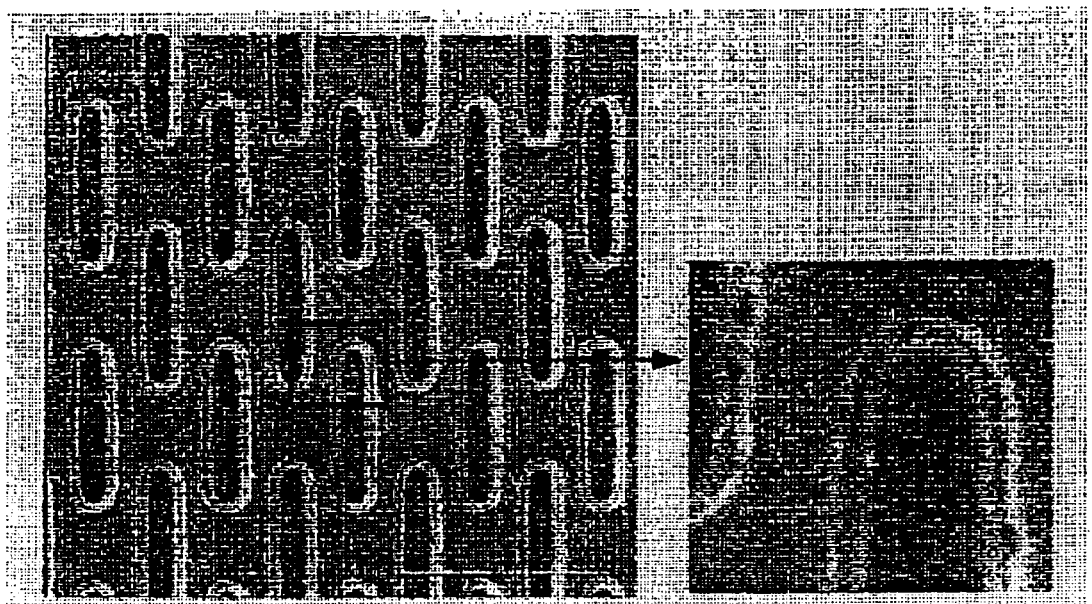
FIG. 5 is a photograph illustrating a method for fabricating an isolation layer in a semiconductor device according to the present invention, which shows almost no fine pores defects produced in a flowing insulating layer.

Further, FIG. 5 is a photograph that shows occurrence of fine pores being decreased in the isolation layer produced by the method for fabricating an isolation layer in a semiconductor device according to the present invention.

Figure 3A:
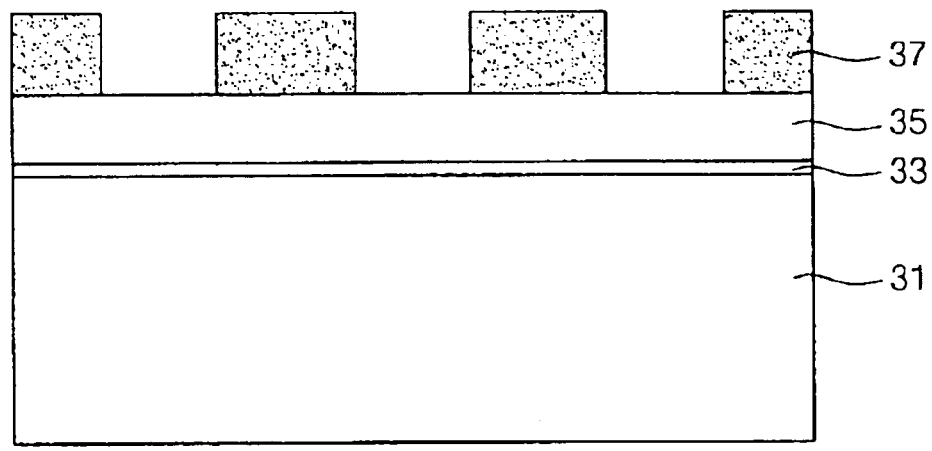
FIGS. 3A through 3D are cross-sectional views each illustrating a method for fabricating an isolation layer in a semiconductor device according to one embodiment of the present invention.

As shown in FIG. 3A, a pad oxide film 33 acting as a buffer, and a pad nitride film 35 inhibiting oxidation are sequentially formed on a silicon substrate 31 first, and then a photoresist film pattern 37 is formed above the pad nitride film 35 in order to define isolation intended regions.

Figure 3B:
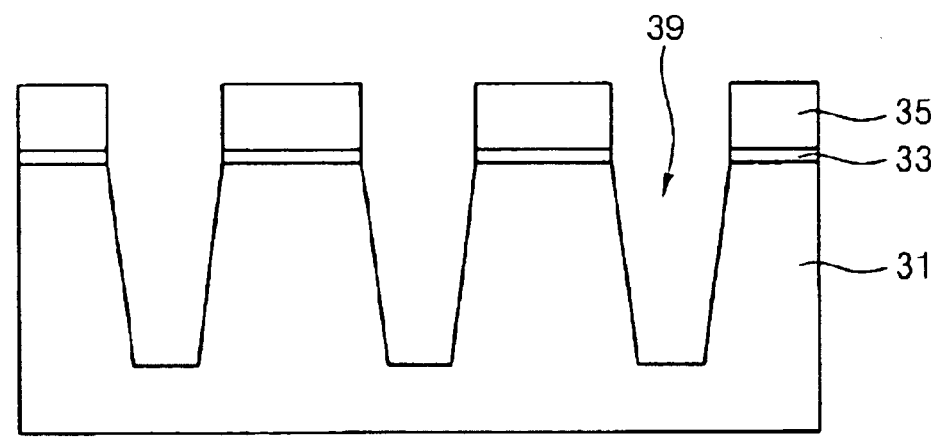

Then, as shown in FIG. 3B, the pad nitride film 35, the pad oxide film 33, and the silicon substrate 31 are etched to a certain depth by using the photoresist film pattern 37 as a mask thereby forming a trench 39.

Subsequently, the photoresist film pattern 39 is removed, and a sacrificial oxide film (not shown) is formed on the silicon substrate 31 inclusive of the trench 39 and then is removed in order to settle stresses originated during the trench etching process thereby alleviating etching damages.

Also, a thin oxide film can be preferably formed in the trench by performing a side wall oxidation process, or an oxide film can be formed to a thickness ranging from 20 to 200 Å in a furnace maintained at temperature above 600° C. in order to prevent a leakage current produced between trench interfaces of the silicon substrate before depositing a flowing insulating layer.

In this instance, additionally a nitride film can be preferably formed to a thickness ranging from 10 to 200 Å in the trench of the silicon substrate according to an LPCVD or an ALD process in order to prevent loss of the oxide film formed at the time of side wall oxidation of the trench.

Meanwhile, a nitride film and an oxide film can preferably be sequentially deposited in the trench to a thickness ranging from 10 to 200 Å in order to prevent defects of the silicon substrate produced at the time of depositing a flowing insulating layer or performing a HDPCVD process.

Subsequently, several plasma treatments are sequentially and simultaneously performed according to an in-situ process at a power more than 100 W and for more than 2 seconds under using $SiC_xH_y$ (x falls in the range of 0~4, and y falls in the range of 0~12), $SiO_xC_y$ (the value of x falls in the range of 0~4, and that of y falls in the range of 0~12), Ar, He, $N_2$, $N_2O$, $H_2O$, $H_2O_2$, $NH_3$, or $O_2$ gas in order to control adhesive forces, flowing property and improve the ability to fill gaps, just before forming a flowing insulating layer.

Figure 3C:
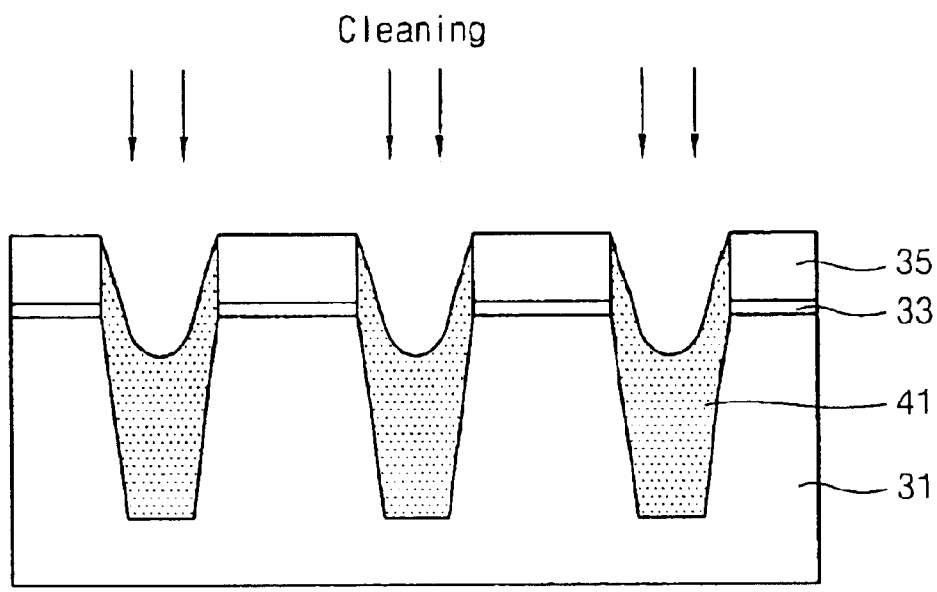

Then, as shown in FIG. 3C, a flowing insulating layer 41 is formed below the pretreated trench 39. In this instance, the flowing insulating layer 41 is formed as a SHO film ($SiO_xH_y$; the value of x falls in the range of 0~4, and that of y falls in the range of 0~12) by using a reaction source of $SiH_4$ and $H_2O_2$ according to an LPCVD (Low Pressure Chemical Vapor Deposition) manner in an in-situ process, the SHO film being preferably formed to be 50~5000 Å in thickness.

Also, the SHO film is formed at a temperature ranging from −10 to 150° C. and at a low pressure ranging from 10 mTorr to 100 Torr using reaction gases of $SiH_3$, $SiH_a(CH_3)_b$ (the value of a falls in the range of 0~4, and that of b falls in the range of 0~4), $H_2O_2$, $O_2$, $H_2O$ and $N_2O$ gas. In this instance, $N_2$, Ar, He, and $H_2$ gases are used as an inactive gas in order to control deposition rate and uniformity of the film at the time of forming the SHO insulating layer. Also, the contents of $H_2O_2$ are controlled to range from 10 to 80 wt. % in comparison with $H_2O$ in order to control deposition rate and flowing property at the time of forming the SHO insulating layer.

Subsequently, a heat treatment process is carried out to make the SHO film 41, which is a flowing insulating layer, precise in the following process. In this instance, the precision process of the SHO film 41 is carried out at pressures ranging from 0 mTorr to 10 Torr and for more than 5~300 seconds by means of a plasma using $SiH_4$, $SiH_a(CH_3)_b$ (the value of a falls in the range of 0~4, and that of b falls in the range of 0~4), $N_2$, $NH_3$, $O_2$, $O_3$, $N_2O$, Ar or He gas. Also, the heat treatment is carried out in a mixed gas of $O_2$, $N_2$, $O_3$, $N_2O$ and $H_2+O_2$ at a temperature ranging from 300 to 850° C. for more than one minute in order to make the flowing insulating layer precise.

Then, a cleaning process is carried out to improve flowing property thereby preventing defects produced at sidewalls of the trench, before forming an insulating layer in the following process according to an HDPCVD process. In this instance, the cleaning process is carried out sequentially and simultaneously according to one or more methods selected from the following cleaning methods: 1) cleaning at a temperature ranging from room temperature to 150° C. with using a BOE (buffered oxide etchant) solution, which comprises an etching solution and a buffer solution in a ratio ranging from 3:1 to 500:1, or with using a mixed solution made of $H_2SO_4$ and $H_2O_2$ solution in a volume ratio ranging from 1:1 to 500:1, 2) cleaning by means of wet-etching with using SC-1 (standard cleaning-1), SC-2 (standard cleaning-2) cleaning solution after diluted by 5:1~500:1 HF.

Meanwhile, after depositing the flowing insulating layer 41 and prior to forming a precise insulating layer, the over-deposited portion of the flowing insulating layer at certain patterns is etched by a thickness ranging from 10 to 3000 Å by way of a wet-etching or a dry-etching.

Figure 3D:
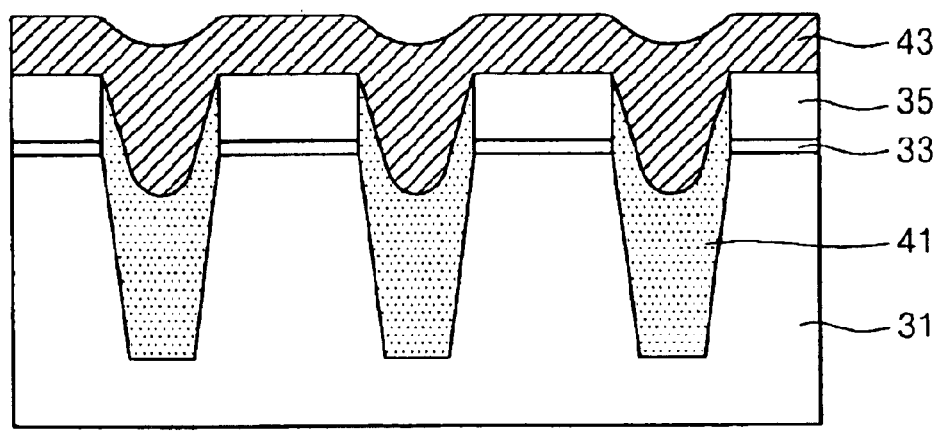

Then, as shown in FIG. 3D, a relatively precise insulating layer 43 is deposited on a surface of the whole structure inclusive of the flowing insulating layer 41. In this instance, the precise insulating layer 43 is deposited according to an HDP-CVD process using a $SiH_4$ reaction gas or an AP-CVD or an SA-CVD process using a TEOS reaction gas.

Subsequently, a heat treatment is carried out in an atmosphere of $O_2$, $N_2$, $O_3$, $N_2O$, and $H_2+O_2$ mixed gas at a temperature ranging from 300 to 12000° C. for more than 5 minutes or an RTP (Rapid Thermal Process) can be carried out at a temperature more than 600° C. for more than one second in order to make the entire precise insulating layer 43 more precise.

Then, an insulating layer (not shown) is deposited to a thickness more than 50 Å in order to make the lower insulating layer precise together with depositing the precise insulating layer. In this instance, deposition of the insulating layer (not shown) is carried out in an atmosphere of $SiH_4$, TEOS, DCS, $O_2$, $N_2O_3$, $N_2O$, and $H_2+O_2$ mixed gas at a temperature ranging from 500 to 11000° C.

Thereafter, although not shown in the drawing, the insulating layers are sequentially removed by way of a planarization process, etc., thereby forming an isolation layer in the semiconductor device.

Meanwhile, the method for fabricating an isolation layer in a semiconductor device according to another embodiment of the present invention is discussed below with reference to FIGS. 4A through 4D.

Figure 4A:
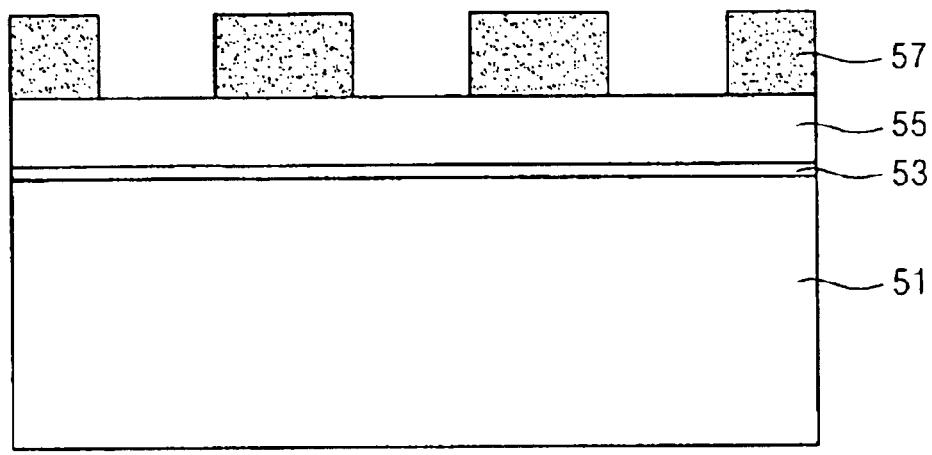
FIGS. 4A through 4D are cross-sectional views each illustrating a method for fabricating an isolation layer in a semiconductor device according to another embodiment of the present invention.
Figure 4B:
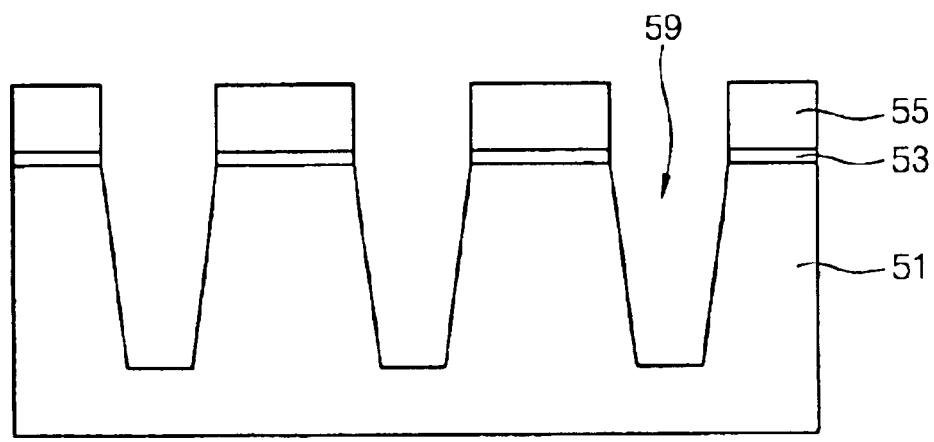
Figure 4C:
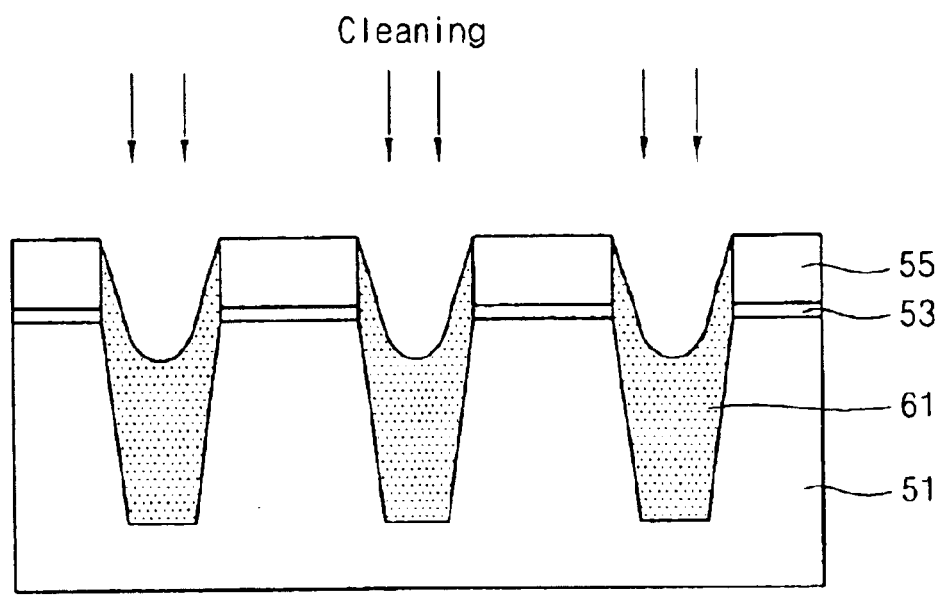

As the fabrication processes shown in FIGS. 4A through 4C of the fabricating method of an isolation layer in a semiconductor device according to another embodiment of the present invention are same as those of the above explained embodiment of the present invention, detailed descriptions thereof are omitted. That is, detailed descriptions of the trench 59 formation process shown in FIGS. 4A and 4B, and detailed descriptions of the deposition process of the flowing insulating layer 61 shown in FIG. 4C are omitted.

Then, a heat treatment process is carried out to make the SHO film 61, which is a flowing insulating layer, precise. In this instance, the precision process of the SHO film 61 is carried out at pressures above 100 Torr and for more than 5~300 seconds by means of a plasma using $SiH_4$, $SiH_a(CH_3)_b$ (the value of a falls in the range of 0~4, and that of b falls in the range of 0~4), $N_2$, $NH_3$, $O_2$, $O_3$, $N_2O$, Ar or He gas. Also, the heat treatment is carried out in a mixed gas of $O_2$, $N_2O_3$, $N_2O$ and $H_2+O_2$ at a temperature ranging from 300 to 850° C. for more than one minute in order to make the flowing insulating layer precise.

Subsequently, a cleaning process is carried out to improve flowing property thereby preventing defects produced at sidewalls of the trench, before forming an insulating layer in the following process according to an HDPCVD process. In this instance, the cleaning process is carried out sequentially and simultaneously according one or more methods selected from the following cleaning methods: 1) cleaning at a temperature ranging from room temperature to 150° C. with using a BOE (buffered oxide etchant) solution, which comprises an etching solution and a buffer solution in a ratio ranging from 3:1 to 500:1, or with using a mixed solution made of $H_2SO_4$ and $H_2O_2$ solution in a volume ratio ranging from 1:1 to 500:1, 2) cleaning by means of wet-etching with using SC-1 (standard cleaning-1), SC-2 (standard cleaning-2) cleaning solution after diluted by 5:1~500:1 HF.

Meanwhile, after depositing the flowing insulating layer 61 and prior to forming a precise insulating layer, the over-deposited portion of the flowing insulating layer at certain patterns is etched by a thickness ranging from 10 to 3000 Å by way of a wet-etching or a dry-etching.

Figure 4D:
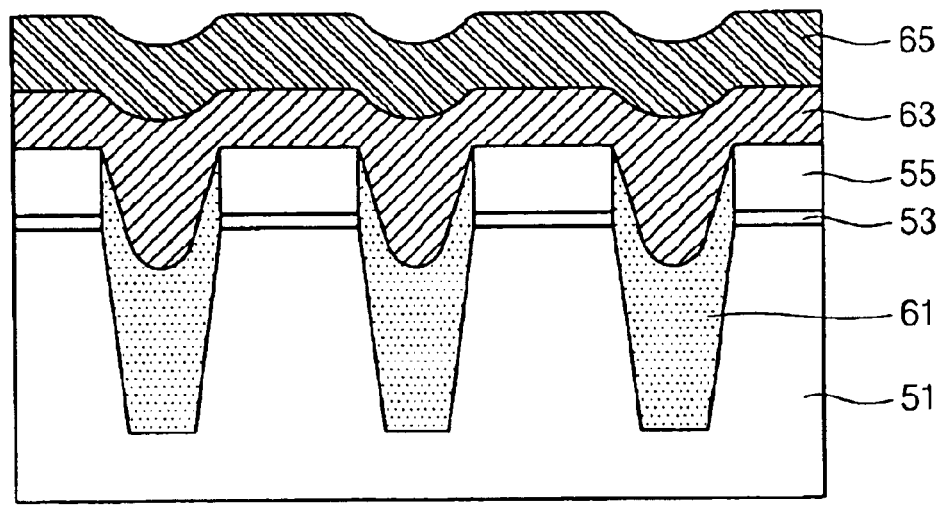

Then, as shown in FIG. 4D, a relatively precise insulating layer 63 is deposited on the surface of overall structure inclusive of the flowing insulating layer 61. In this instance, the precise insulating layer 63 is deposited according to an HDP-CVD process using a $SiH_4$ reaction gas or an AP-CVD or an SA-CVD process using a TEOS reaction gas.

Subsequently, a heat treatment is carried out in an atmosphere of $O_2$, $N_2$, $O_3$, $N_2O$, and $H_2+O_2$ mixed gas at a temperature ranging from 300 to 12000° C. for more than 5 minutes or an RTP (Rapid Thermal Process) can be carried out at a temperature more than 600° C. for more than one second in order to make the entire precise insulating layer 63 more precise.

Thereafter, a thermal insulating layer 65 for a CMP (Chemical Mechanical Polishing) is deposited on the precise insulating layer 63 to fill the insulating layer of the wide trench part according to a HDP-CVD process using an $SiH_4$ reaction gas or an AP-CVD, an SA-CVD process using a TEOS reaction gas. In this instance, the thermal-insulating layer 65 is additionally deposited on the relatively precise insulating layer 63 to a thickness ranging from 50 to 5000 Å for the purpose of making the lower insulating layer precise. Also, the thermal-insulating layer 65 is deposited in an atmosphere of $SiH_4$, TEOS, DCS, $O_2$, $N_2$, $O_3$, $N_2O$, and $H_2+O_2$ mixed gas and at a temperature ranging from 500 to 1100° C.

Then, although not shown in the drawing, the insulating layers are sequentially removed by way of a planarization process, etc., thereby forming an isolation layer in the semiconductor device.

As discussed above, according to the method for fabricating an isolation layer in a semiconductor device of the present invention, the number of fine pores defects produced in the cells can be considerably diminished by alleviating the NO plasma treatment due to pretreatment at the time of depositing the flowing insulating layer and performing BN or FN post cleaning process without delay.

Further, as shown in FIG. 5, fine pores defects have been radically diminished along with the removal of the fine nano pores formed at sidewalls of the active region at the time of cleaning process using a HF after performing an annealing of the flowing insulating layer.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating an isolation layer in a semiconductor device, the method comprising the steps of:
   forming a trench on a semiconductor substrate;
   forming a flowing insulating layer within the trench, wherein the flowing insulating layer comprises an SHO ($SiO_xH_y$; the value of x falls in the range of 0~3, and that of y falls in the range of 0~1) insulating layer;
   making the insulating layer precise; and
   forming a precise insulating layer over an upper surface of the whole structure on which the flowing insulating layer is formed.

2. The method as claimed in claim 1, further comprising a step of carrying out a pretreatment by an in-situ prior to forming the flowing insulating layer, wherein the pretreatment step is carried out by a cleaning treatment or a plasma treatment.

3. The method as claimed in claim 2, wherein the plasma treatment is carried out for at least 5 seconds at a pressure below 100 Torr with a plasma using $SiH_4$, $SiH_a(CH_3)_b$ (the value of a falls in the range of 0~4, and that of b falls in the range of 0~4), $N_2$, $N_2O$, $NH_3$, $O_2$, $O_3$, Ar or He gas.

4. The method as claimed in claim 1, further comprising a step of oxidizing sidewalls of the trench prior to forming the flowing insulating layer.

5. The method as claims in claim 4, the oxidizing step is carried out at a furnace maintained at more than 600° C. to form an oxide film ranging from 20 to 200 Å.

6. The method as claimed in claim 4, further comprising a step of forming a nitride film within the trench according to an LPCVD or an ALD manner after oxidizing the sidewalls of the trench.

7. The method as claimed in claim 1, further comprising a step of sequentially forming a nitride film and an oxide film at an inner surface of the trench prior to forming the flowing insulating layer.

8. The method as claimed in claim 1, wherein the flowing insulating layer using SHO is formed to a thickness ranging from 60 to 5000 Å.

9. The method as claimed in claim 1, wherein the SHO insulating layer used as a flowing insulating layer is formed by using a reaction source of $SiH_4$ and $H_2O_2$ by way of an in-situ according to an LPCVD process.

10. The method as claimed in claim 9, wherein the SHO insulating layer is formed at a temperature ranging from −10 to 150° C. and at a low pressure below 100 Torr using a reaction gas of $SiH_4$, $SiH_a(CH_3)_b$ (the value of a falls in the range of 0~4, and that of b falls in the range of 0~4), $H_2O_2$, $O_2$, $H_2O$ and $N_2O$ gas.

11. The method as claimed in claim 1, further comprising a step of post-cleaning the flowing insulating layer, wherein the post-cleaning step is carried out sequentially and simultaneously according to one or more methods selected from the following cleaning manners: 1) cleaning at a temperature ranging from room temperature to 150° C. with using a BOE (buffered oxide etchant) solution, which comprises an etching solution and a buffer solution in a ratio ranging from 3:1 to 500:1, or with using a mixed solution made of $H_2SO_4$ and $H_2O_2$ solution in a volume ratio ranging from 1:1 to 500:1, 2) cleaning by means of wet-etching with using SC-1 (standard cleaning-1), SC-2 (standard cleaning-2) cleaning solution after diluting with 5:1~500:1 HF.

12. The method as claimed in claim 1, wherein the step of making the flowing insulating layer precise is carried out in an atmosphere of $O_2$, $N_2$, $O_3$, $N_2O$, and $H_2+O_2$ mixed gas at a temperature ranging from 300 to 850° C. for more than 1 minute or carried out in an atmosphere of $O_2$, $N_2$, $O_3$, $N_2O$, and $H_2+O_2$ mixed gas at a temperature ranging from 300 to 12000° C. for more than 5 minutes or carried out by performing an RTP (Rapid Thermal Process) at a temperature more than 600° C. for more than one second.

13. The method as claimed in claim 1, wherein the step of making the flowing insulating layer precise is carried out at a pressure ranging from 0 mTorr to 10 Torr and for more than 5~300 seconds by means of a plasma using $SiH_4$, $SiH_a(CH_3)_b$ (the value of a falls in the range of 0~4, and that of b falls in the range of 0~4), $N_2$, $NH_3$, $O_2$, $O_3$, $N_2O$, Ar or He gas.

14. The method as claimed in claim 1, wherein the precise insulating layer comprises a HDP or a USG film.

15. The method as claimed in claim 1, further comprising a step of heat treatment of the resultant substrate after the formation of the precise insulating layer, wherein the heat treatment is carried out in an atmosphere of $O_2$, $N_2$, $O_3$, $N_2O$, and $H_2+O_2$ mixed gas at a temperature ranging from 300 to 12000° for more than 5 minutes or by performing an RTP (Rapid Thermal Process) at a temperature more than 600° C. for more than one second.

16. A method for fabricating an isolation layer in a semiconductor device, the method comprising the steps of:

providing a semiconductor substrate on which a trench is formed;

carrying out a pretreatment of the trench;

forming a flowing insulating layer below the pretreated trench;

post-cleaning the flowing insulating layer;

making the insulating layer precise;

forming an insulating layer on an upper surface of whole structure on which the precise insulating layer so formed; and forming a thermal-insulating layer above the insulating layer.

17. The method as claimed in claim 16, further comprising a step of a plasma treatment or an annealing treatment prior to the post-cleaning treatment of the flowing insulating layer.

18. The method as claimed in claim 16, wherein the post-cleaning step is carried out sequentially and simultaneously according to one or more methods selected from the following cleaning manners: 1) cleaning at a temperature ranging from room temperature to 150° C. with using a BOE (buffered oxide etchant) solution, which comprises an etching solution and a buffer solution in a ratio ranging from 3:1 to 500:1, or with using a mixed solution made of $H_2SO_4$ end $H_2O_2$ solution in a volume ratio ranging from 1:1 to 500:1, 2) cleaning by means of wet-etching with using SC-1 (standard cleaning-1), SC-2 (standard cleaning-2) cleaning solution after diluting with 5:1~500:1 HF.

19. The method as claimed in claim 16, wherein the pretreatment step comprises a cleaning or a plasma treatment.

20. The method as claimed in claim 16, wherein the precise insulating layer is deposited by way of an HDP-CVD manner using a $SiH_4$, reaction gas or an AP-CVD manner using a TEOS reaction gas.

21. The method as claimed in claim 16, wherein the insulating layer is formed by carrying out in an atmosphere of $O_2$, $N_2$, $O_3$, $N_2O$, and $H_2+O_2$ mixed gas at a temperature ranging from 300 to 12000° C. for more than 5 minutes or by performing an RTP (Rapid Thermal Process) at a temperature more than 600° C. for more than one second.

22. The method as claimed in claim 16, the thermal insulating layer is deposited by way of an HDP-CVD manner using a $SiH_4$ reaction gas or an AP-CVD, an SA_CVD manner using a TEOS reaction gas.

* * * * *